(12) United States Patent
Porter et al.

(10) Patent No.: US 7,785,137 B2
(45) Date of Patent: Aug. 31, 2010

(54) INTEGRAL METER JAW ASSEMBLY MOUNTING RISER

(76) Inventors: Thomas E. Porter, 16015 E. Highway, Camden Point, MO (US) 64018; Shawn J. Glasgow, 107 NW. 112th St., Kansas City, MO (US) 64155; Jeffrey A. Bushman, 201 S. Blitz St., Concordia, MO (US) 64020; John V. Siglock, 4029 N. Bennington, #104, Kansas City, MO (US) 64117

( * ) Notice: Subject to any disclaimer, the term of this patent is extended or adjusted under 35 U.S.C. 154(b) by 0 days.

(21) Appl. No.: 11/866,347

(22) Filed: Oct. 2, 2007

(65) Prior Publication Data

US 2008/0081510 A1    Apr. 3, 2008

Related U.S. Application Data

(60) Provisional application No. 60/848,948, filed on Oct. 3, 2006.

(51) Int. Cl.
*H01R 33/945* (2006.01)

(52) U.S. Cl. ..................................................... 439/517

(58) Field of Classification Search .................. 439/517, 439/507, 801, 146, 167, 790–791, 793, 839; 361/659, 668, 670, 664
See application file for complete search history.

(56) References Cited

U.S. PATENT DOCUMENTS

| | | | |
|---|---|---|---|
| 4,104,588 A * | 8/1978 | Westberry | 324/110 |
| 4,201,439 A * | 5/1980 | M'Sadoques | 439/839 |
| 5,595,316 A | 1/1997 | Gallarelli et al. | |
| 5,870,276 A | 2/1999 | Leach et al. | |
| 6,561,844 B1 * | 5/2003 | Johnson | 439/507 |
| 6,679,723 B1 * | 1/2004 | Robinson | 439/483 |
| 2005/0227532 A1 | 10/2005 | Kellerman | |

* cited by examiner

*Primary Examiner*—Edwin A. Leon
(74) *Attorney, Agent, or Firm*—Richard Stitt; Polsinelli Shughart PC

(57) ABSTRACT

An integral riser structure for a watt-hour meter enclosure to provide a mounting structure for a pair of meter jaw assemblies includes a pair of laterally spaced riser walls formed integrally with a back wall of the enclosure and positioned in forwardly spaced relation to the back wall. The riser walls are separated by a recessed wall positioned in a recessed plane located between the plane of the riser walls and the plane of the back wall. The riser walls include holes to receive fasteners to secure the meter jaw assemblies to the riser walls.

3 Claims, 4 Drawing Sheets

INTEGRAL METER JAW ASSEMBLY MOUNTING RISER

CROSS-REFERENCE TO RELATED APPLICATION

This application claims priority under 35 U.S.C. 119(e) and 37 C.F.R. 1.78(a)(4) based upon U.S. Provisional Application, Ser. No. 60/848,948 for AN IMPROVED METER JAW ASSEMBLY MOUNTING METHOD, filed Oct. 3, 2006, which is incorporated herein by reference.

BACKGROUND OF THE INVENTION

The present invention relates generally to metal enclosures, and more particularly, to a meter socket enclosure, such as for use in watt-hour meter sockets. This type of socket is known in the trade as an "S" type meter socket. The dimensions of such enclosures are determined by various factors. The width of the enclosure must be wide enough to accept a conventional watt-hour meter and any utility or customer wiring cable that may need to pass along the side of the meter socket. The length of the enclosure must also be able to accept the watt-hour meter and must also provide sufficient "wire-bending" space as required for installation or by regulating agencies, such as Underwriters' Laboratories, Inc. The depth of the enclosure must accept the meter socket assembly components and be deep enough to provide sufficient space for the conduit used to protect the utility and customer wires and the locknuts used to secure these conduits. To minimize tooling costs, manufacturers typically standardize on the meter socket assembly components used for sockets of various ampere ratings, such as 100 ampere and 200 ampere sockets. Electric codes and standards specify wire size requirements and also the conduit sizes required for these ampere ratings. As a direct consequence of the aforementioned constraints, 100 ampere and 200 ampere meter sockets are usually of the same width, but may be a different length (to allow for the wire bending requirements) and a different depth to allow for the differing conduit requirements.

In prior art, the meter jaw assemblies are constructed so that they fit in the minimum height required for 100 amp conduit trade size of 2 inches (5.08 cm). When the same meter jaw assemblies are used in a 200 ampere meter socket enclosure, which requires a 2.5 inches (6.35 cm) trade size conduit, additional components are employed to raise the meter jaw assemblies to the correct height to receive the watt-hour meter. This additional height is approximately 0.75 to 0.875 inch (1.91-2.22 cm) in most modern designs.

FIGS. 1 and 2 show internal components of a typical modern 200 ampere enclosure 100. Meter jaw assemblies 102 are attached to a riser or bridge 106 that provides the proper mounting height or spacing from a back wall 110 of the enclosure 100. Mounting screws 114 attach the bridge 106 to the back wall 110 enclosure 100. Mounting holes and optional dimple features (not shown) may be provided to mount the bridge 106 and meter jaw assemblies 102. FIG. 1 shows a view of the mounting bridge 106 having 118 to engage the holes or dimples and holes 122, such as the slotted holes illustrated, to permit fastening with the screws 114 to the enclosure back wall 110. Also shown are extruded holes 126 which may be tapped to allow the fastening of the meter jaw assemblies 102 to the bridge 106. Additional features of conventional meter socket enclosures, mounting bridges 106, and meter jaw assemblies can be found in U.S. patent application Ser. No. 11/849,708, which is incorporated herein by reference.

The illustrated bridge 106 includes laterally spaced mounting walls 130 on which the meter jaw assemblies 102 are secured, as by fasteners or screws 132. The extruded holes 126 may be formed in the mounting walls to receive the screws 132. The holes 126 are spaced in such a manner as to provide the proper spacing between transverse sets of meter socket jaws 136 to receive connector blades of a standard watt-hour meter (not shown). The mounting walls 130 are separated by a recessed wall 140, which may be used to mounting a grounding conductor connector (not shown). The illustrated bridge 106 is provided with laterally spaced mounting flanges 142 having the holes 118 and 122 formed therein for mounting to the back wall 110 of the enclosure 100.

The prior art construction described above has disadvantages. Firstly, the use of additional components acts to increase both material and labor costs. Secondly, the bridge component contributes to reduced stability of the meter mounting position, both on initial positioning and in resistance to side loading forces.

SUMMARY OF THE INVENTION

It is an object of this invention to reduce the number of components required to manufacture meter sockets of various ampere ratings. It is a further object of this invention to reduce the number of manufacturing operations required to manufacture meter sockets of various ampere ratings. It is a further object of this invention to increase the accuracy of the meter mounting position. It is yet another object of this invention to increase the rigidity or stiffness of the meter mounting position.

The present invention provides an improved meter socket jaw assembly mounting structure in the form of integral risers which are formed monolithically with the back wall of a meter socket enclosure. An embodiment of the invention includes a pair of laterally spaced meter socket jaw assembly mounting walls spaced from the back wall of the enclosure. The mounting walls are separated by a recessed wall which is spaced between a mounting plane in which the mounting walls are located and a back wall plane. The mounting walls are provided with holes to receive fasteners to secure the meter socket jaw assemblies thereto. In an embodiment of the invention, the integral risers are formed by stamping the back wall with an appropriately shaped set of dies during manufacture of the enclosure. The stamping process may occur in a single step or may involve a progression of steps. Additionally, manufacture of the enclosure and formation of the integral risers may involve various metal treating actions which will occur to those skilled in metal forming arts.

Objects and advantages of this invention will become apparent from the following description taken in conjunction with the accompanying drawings wherein are set forth, by way of illustration and example, certain embodiments of this invention.

The drawings constitute a part of this specification and include exemplary embodiments of the present invention and illustrate various objects and features thereof.

DETAILED DESCRIPTION OF THE INVENTION

Figure 1:
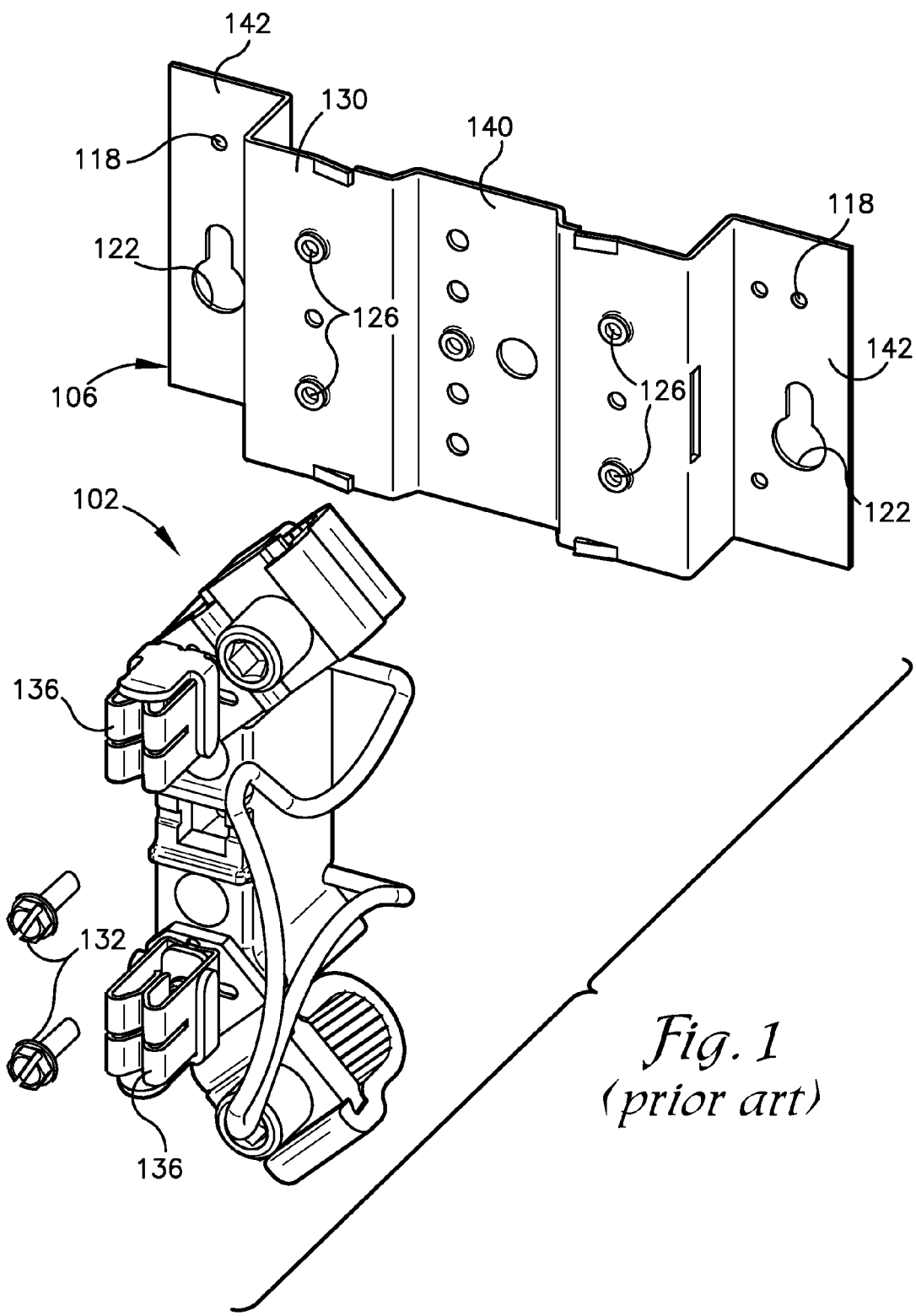
FIG. 1 is an exploded perspective view of a watt-hour meter jaw assembly and a prior art mounting riser on which the meter jaw assembly is mounted.
Figure 2:
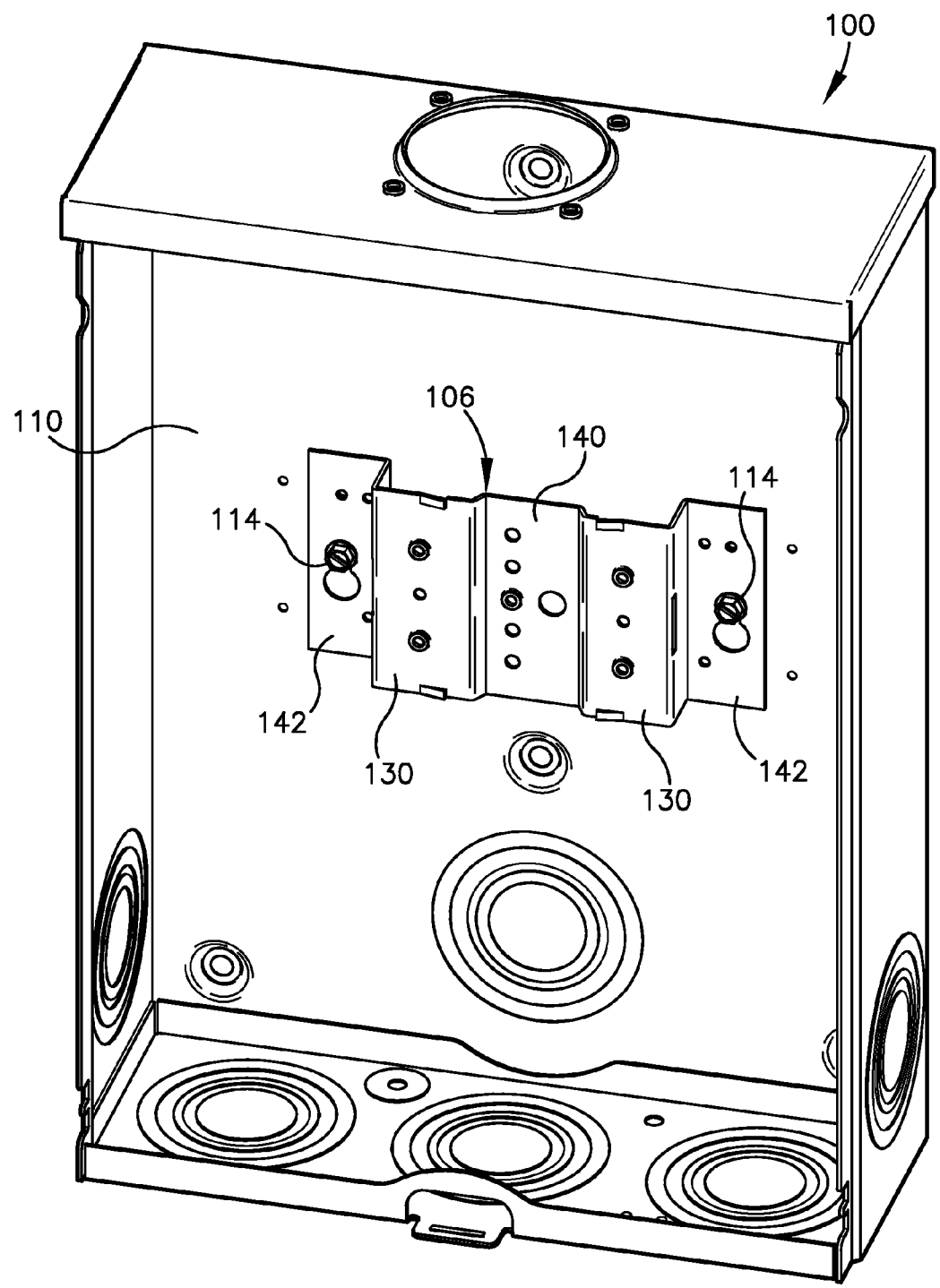
FIG. 2 is a perspective view of a conventional watt-hour meter socket enclosure with a conventional riser mounted therein, shown at a reduced scale from FIG. 1.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Referring to the drawing figures in more detail, the reference numeral 1 generally designates an embodiment of a set of integral or embossed risers according to the present invention. The risers structure 1 is provided in a watt-hour meter enclosure 2 to provide an improved mounting structure for watt-hour meter jaw assemblies 3 to position the assemblies 3 to receive a type of watt-hour meter (not shown) which is standard in the electrical power industry.

Figure 3:
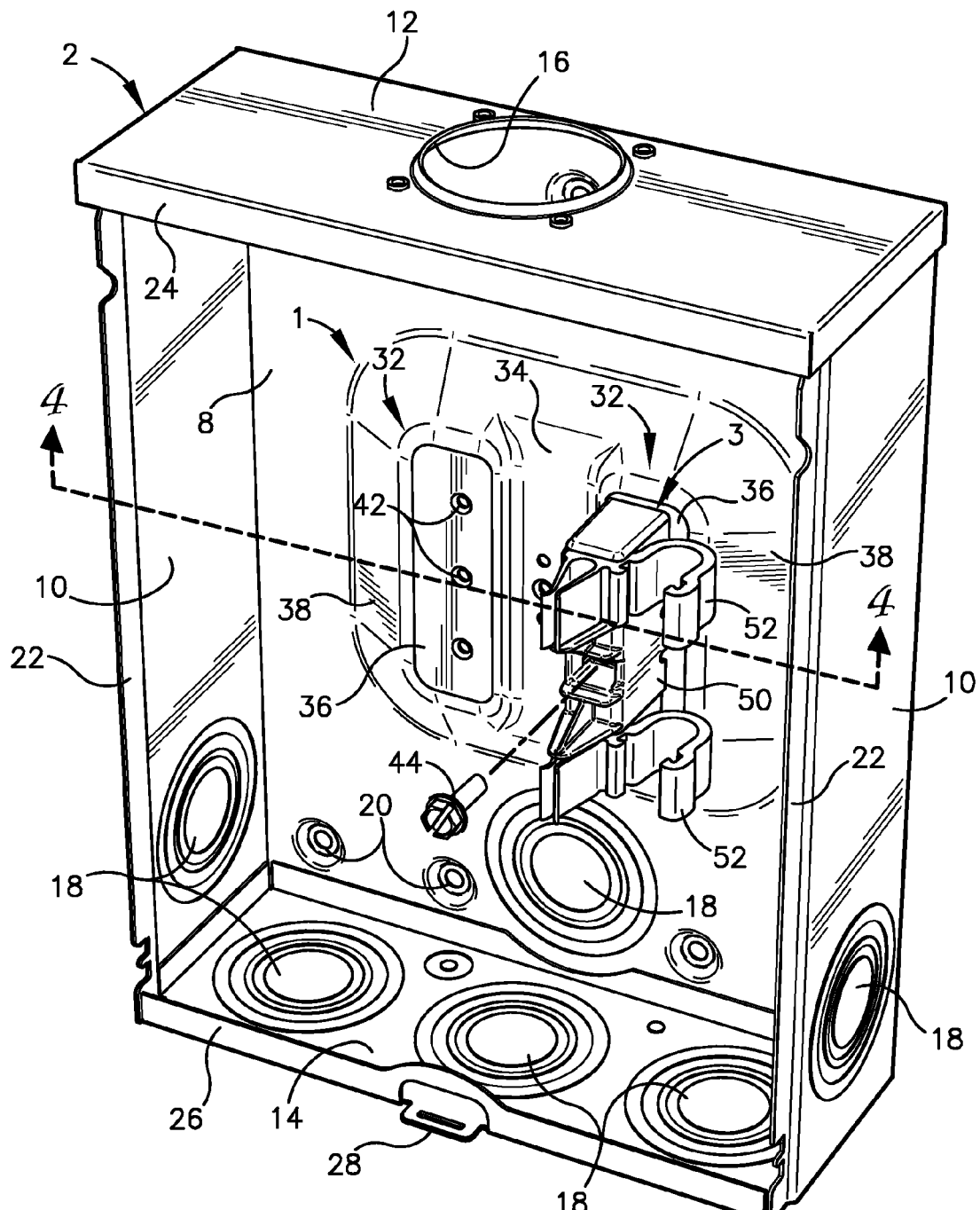
FIG. 3 is a perspective view of a watt-hour meter socket enclosure incorporating an embodiment of integral meter jaw assembly mounting risers according to the present invention.
Figure 4:
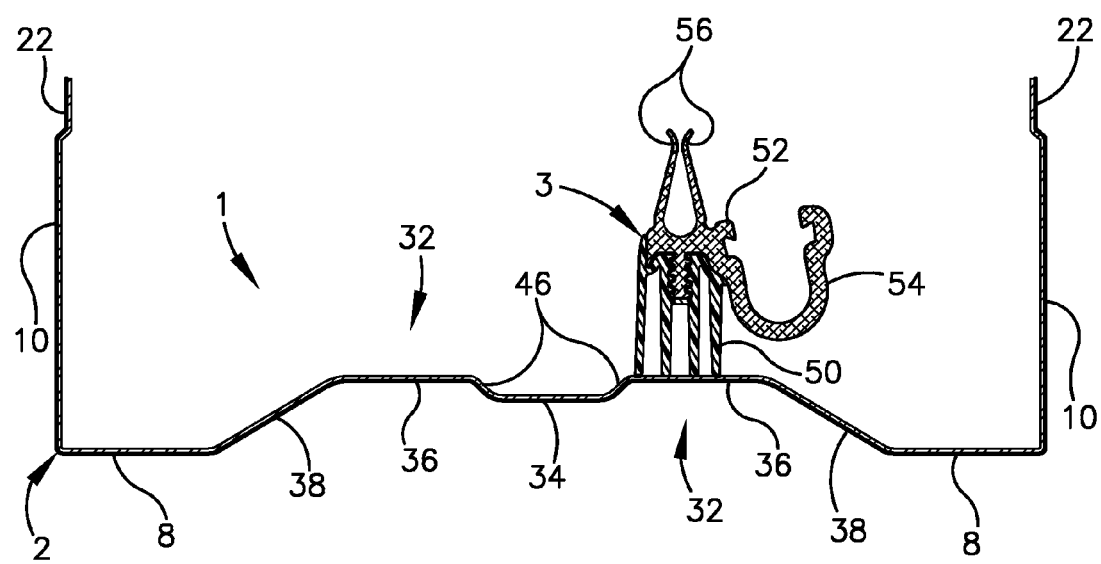
FIG. 4 a transverse sectional view taken on line 4-4 of FIG. 3 and illustrates contour details of the integral risers with a meter jaw assembly secured to one of the risers.

Referring to FIGS. 3 and 4, the illustrated enclosure 2 includes a back or rear wall 8, a pair of laterally spaced side walls 10, a top wall 12, and a bottom wall 14. Although not shown, the enclosure 2 includes a front wall with a circular opening through which portions of the watt-hour meter extend. The illustrated side walls 10 are integral with the back wall 8 and are formed by bending side portions of an enclosure blank. The top and bottom walls 12 and 14 are formed as separate members and are secured to the back wall 8 and side walls 10 as by spot welding, fasteners, or the like. It is foreseen that the top and bottom walls 12 and 14 could alternatively be formed integral with the back wall 8. The illustrated top wall 12 is provided with an opening 16 to receive power conductors (not shown) from an electrical utility. The bottom wall 14 and lower portions of the side walls 10 and back wall 8 may be provided with knock-outs 18 which may be selectively opened to enable power conductors (not shown) to exit the enclosure 2. The illustrated back wall 8 is provided with preformed holes 20 which receive fasteners to secure the enclosure 2 to a supporting wall. To accommodate the front wall, the side walls 10 may be provided with in set edges 22 while the top wall 12 and bottom wall 14 include respective flanges 24 and 26. The illustrated bottom wall 14 is also provided with a slotted tab 28 to receive an enclosure tamper seal (not shown).

The illustrated riser structure 1 includes a pair of laterally spaced integral risers 32 separated by a recessed wall 34. Each riser 32 is formed by a planar riser wall 36 which are in a common riser plane spaced forward of a back wall plane in which the back wall 8 is located. The spacing of the riser wall 36 from the back wall 8 is determined to properly position the meter jaw assemblies 3 in relation to the back wall 8. The riser walls 36 are connected to the back wall 8 by angled transition walls 38. Each riser wall 36 may be provided with mounting features such as holes 42 to receive mounting screws 44 or location pins on the meter jaw assemblies 3 to thereby secure a jaw assembly 3 to the riser wall 36. The holes 42 may include extruded holes (not shown) similar to the extruded holes 126 in FIG. 1 which may also be helically tapped.

The recessed wall 34 may simply form a separation between the riser walls 36 or it may be provided with holes or other features to receive a ground conductor connector (not shown). The recessed wall 34 is connected to the riser walls 36 by step walls 46 which may be angular in orientation. The illustrated recessed wall 34 is positioned in a recessed plane located between the plane of the back wall 8 and the plane of the riser walls 36. Although the illustrated structure 1 is shown with the recessed wall 34, it is foreseen that the structure 1 could be provided without the recessed wall 34 with single riser wall (not shown) of sufficient width for proper spacing of the meter jaw assemblies 3. Additionally, while the illustrated riser structure 1 is configured to accommodate two meter jaw assemblies 3, it is foreseen that the structure 1 could be readily modified to mount three or more jaw assemblies comparable to the jaw assemblies 3, such as for use with a three-phase watt-hour meter or the like.

Each of the illustrated meter jaw assembly 3 includes an insulative mounting block 50 with a pair of conductive meter jaw connectors 52 secured thereto. The meter jaw connectors 52 include U-shaped conductor receivers 54 and a pair of resilient meter jaw members 56 into which connector blades of a watt-hour meter are inserted. The riser walls 36 and mounting holes 42 are located to provide the proper spacing between sets of the jaws 56 to fit the spacing of connector blades of standard watt-hour meters. Although the meter jaw assembly 3 illustrated in FIGS. 3 and 4 is different from the meter jaw assembly 102 shown in FIG. 1, the riser structure 1 is capable of having the jaw assembly 102 mounted thereon. Additionally, it is not intended that the riser structure 1 be restricted to use with only the meter jaw assemblies 3 or 102. The riser structure 1 is intended to a provide convenient mounting structure for virtually any configuration of watt-hour meter jaw assembly.

The illustrated integral or monolithic riser structure 1 is typically formed by embossing or stamping the back wall 8 between a set of appropriately shaped dies during manufacture of the enclosure 2. The riser structure 1 may be formed by a cold or heated stamping process, either as a single step or progressive stamping process.

Advantages of the integral riser structure include reductions in parts count and in assembly labor. The material costs and labor to install the fasteners to join a separate bridge 106 to the enclosure are not required. Because the riser structure 1 is an integral feature of the enclosure back wall 8, formed in the stamping process of the back, the positional accuracies of the various mounting holes 126 are not reduced by additional components or assemblies. The back 8 of the enclosure 2 is also stiffened by the riser structure 1, and this raised area is not subject to the same displacement as typical separate bridge components.

It is to be understood that while certain forms of the present invention have been illustrated and described herein, it is not to be limited to the specific forms or arrangement of parts described and shown.

What is claimed and desired to be secured by Letters Patent is:

1. A watt-hour meter socket enclosure for supporting a meter socket jaw assembly said enclosure comprising:
    (a) a back wall, opposite side walls extending from said back wall, and opposite top and bottom end walls extending from said back wall, ends of said side walls connecting with ends of said end walls to define an enclosure interior, and
    (b) a convex deformation of said back wall, said deformation extending into said enclosure interior for receiving thereon the meter socket jaw assembly to space the meter socket jaw assembly from said back wall.

2. An enclosure as set forth in claim 1 wherein said deformation is formed in said back wall by a stamping process.

3. An enclosure as set forth in claim 1 wherein said deformation is a first deformation and said enclosure includes a second meter socket jaw assembly receiving deformation spaced from said first deformation.

* * * * *